US012106683B2

(12) United States Patent
Choi et al.

(10) Patent No.: US 12,106,683 B2
(45) Date of Patent: Oct. 1, 2024

(54) TUNNEL BORING MACHINE OPERATION SIMULATION EQUIPMENT, AND METHOD FOR MEASURING OPERATION CAPABILITY OF TUNNEL BORING MACHINE DEVICE USING SAME

(71) Applicants: KOREA INSTITUTE OF CIVIL ENGINEERING AND BUILDING TECHNOLOGY, Goyang-si (KR); DOONA INFORMATION & TECHNOLOGY CO,. LTD., Incheon (KR); KANG NUNG CONSTRUCTION CO., LTD., Seoul (KR)

(72) Inventors: Soon Wook Choi, Goyang-si (KR); Soo Ho Chang, Seoul (KR); Chulho Lee, Gyeonggi-do (KR); Seungchul Do, Incheon (KR); Jung Hyi Kim, Seoul (KR); Kwang Eun Cho, Seongnam-si (KR); Seung Yun Lee, Seoul (KR)

(73) Assignees: KOREA INSTITUTE OF CIVIL ENGINEERING AND BUILDING TECHNOLOGY, Goyang-si (KR); DOONA INFORMATION & TECHNOLOGY CO., LTD., Incheon (KR); KANG NUNG CONSTRUCTION CO., LTD., Seoul (KR)

( * ) Notice: Subject to any disclaimer, the term of this patent is extended or adjusted under 35 U.S.C. 154(b) by 551 days.

(21) Appl. No.: 17/287,832

(22) PCT Filed: Nov. 28, 2019

(86) PCT No.: PCT/KR2019/016594
§ 371 (c)(1),
(2) Date: Apr. 22, 2021

(87) PCT Pub. No.: WO2020/130406
PCT Pub. Date: Jun. 25, 2020

(65) Prior Publication Data
US 2021/0383712 A1    Dec. 9, 2021

(30) Foreign Application Priority Data
Dec. 20, 2018 (KR) .................. 10-2018-0166673

(51) Int. Cl.
*G06F 30/20* (2020.01)
*G06Q 50/20* (2012.01)
(Continued)

(52) U.S. Cl.
CPC ............... *G09B 9/00* (2013.01); *G06F 30/20* (2020.01); *G06Q 50/2057* (2013.01); *G06Q 50/08* (2013.01)

(58) Field of Classification Search
CPC .......... G09B 9/00; G09B 19/24; G06F 30/20; G06Q 50/2057; G06Q 50/08; E21D 9/10
See application file for complete search history.

(56) References Cited

U.S. PATENT DOCUMENTS

2017/0308802 A1\* 10/2017 Ramsøy ................ G06N 20/00

FOREIGN PATENT DOCUMENTS

CN    101533273 A  \*  9/2009  ........... G06F 16/283
CN    102376178         3/2012
(Continued)

OTHER PUBLICATIONS

International Search Report, with English translation, for International Application No. PCT/KR2019/016594, dated Apr. 27, 2020.
(Continued)

*Primary Examiner* — Kandasamy Thangavelu
(74) *Attorney, Agent, or Firm* — KILE PARK REED & HOUTTEMAN PLLC

(57) ABSTRACT

According to the present invention, a tunnel boring machine (TBM) operation simulation equipment includes: a server in which education information a is stored; and an instruction client unit. According to the present invention, it is possible to improve the TBM operation capability of TBM drivers and trainees by providing a TBM simulation environment in which the construction environment is realistically simulated.

11 Claims, 8 Drawing Sheets

(51) Int. Cl.
*G09B 9/00* (2006.01)
*G06Q 50/08* (2012.01)

(56) References Cited

FOREIGN PATENT DOCUMENTS

| CN | 202611767 U | * | 12/2012 | | |
|---|---|---|---|---|---|
| CN | 102568293 B | * | 3/2014 | | |
| CN | 206348848 U | * | 7/2017 | | |
| CN | 105513451 | | 6/2018 | | |
| CN | 108319766 A | * | 7/2018 | ............. | G06F 30/17 |
| EP | 2717181 A1 | * | 4/2014 | ............. | G06F 30/13 |
| KR | 10-2015-0118340 | | 10/2015 | | |
| KR | 10-1778218 | | 9/2017 | | |
| KR | 10-2017-0128919 | | 11/2017 | | |
| KR | 10-2018-0130978 | | 12/2018 | | |
| WO | 01/09867 | | 2/2001 | | |
| WO | WO 0134941 A1 | * | 5/2021 | ........... | E21D 9/0879 |

OTHER PUBLICATIONS

Written Opinion, with English translation, for International Application No. PCT/KR2019/016594, dated Apr. 27, 2020.

* cited by examiner

TUNNEL BORING MACHINE OPERATION SIMULATION EQUIPMENT, AND METHOD FOR MEASURING OPERATION CAPABILITY OF TUNNEL BORING MACHINE DEVICE USING SAME

CROSS-REFERENCE TO RELATED APPLICATION(S)

This application is a national entry of International Application No. PCT/KR2019/016594, filed on Nov. 28, 2019, which claims under 35 U.S.C. § 119(a) and 365(b) priority to and benefits of Korean Patent Application No. 10-2018-0166673 filed on Dec. 20, 2018 in the Korean Intellectual Property Office, the entire contents of which are incorporated herein by reference.

TECHNICAL FIELD

The present invention belongs to the field of construction, and in more detail, to a TBM operation simulation equipment for measuring and improving the operation capability of TBM operation engineers and trainees by realistically simulating the TBM operation situation, and a method for measuring TBM device operation capability using the same.

BACKGROUND ART

A Tunnel Boring Machine (TBM) is a large tunnel excavator that crushes rock or ground and refers to a device that continuously performs excavation, burr removal, and support work by rotating a cutter head equipped with a plurality of disk cutters on the front. Excavation work by TBM is more advantageous to constructing long tunnels than blasting excavation.

The recent excavation of tunnels and underground spaces is aimed at increasing worker stability (or safety), reducing civil complaints due to noise and vibration, and reducing construction costs, and by replacing the existing blasting method, there is a trend that the mechanized construction by TBM is increasing significantly, based on the growth of subways, electric power stations, and communication tunnels.

However, since the operation opportunity of the TBM is not easily accessible, most trainees rely only on theoretical education (or apprenticeship education).

Accordingly, since training skilled operation engineers is difficult, it is difficult to cope with unexpected situations occurring at the actual construction site and it is also possible to complain difficulties in normal device operation.

Accordingly, it is necessary to provide a practical simulation environment for the training of TBM operation engineers, but there is no technology for this.

DISCLOSURE

Technical Problem

The present invention is derived to simulate the TBM operation simulation environment described above, and an object of the present invention is to provide a TBM simulation environment in which the construction environment is realistically simulated to improve the TBM operation capability of TBM drivers and trainees.

Another object of the present invention is to extract standards information using an actual TBM operation database so that the operation method of an experienced operator can be easily trained.

Technical Solution

According to one aspect of the present invention, a TBM operation simulation equipment includes: a server 100 in which education information a is stored; and an instruction client unit 200 that is connected to the server 100 through a communication unit 230 and selects some of the education information a as selected education information b and transmits the selected education information b to an education client unit 300, wherein the education client unit 300 includes: a display unit 310 configured to display the selected education information b; an input unit 320 configured to receive selection information c corresponding to the selected education information b; and a control unit 340 configured to control the display unit 310 and the input unit 320, wherein the education client unit 300 is connected to the server 100 and the instruction client unit 200 through a communication unit 330, wherein the control unit 340 transmits the selection information c inputted through the input unit 320 to the instruction client unit 200

In this case, the instruction client unit 200 may include: a display unit 210 configured to display the selection information c; an input unit 220 configured to receive the selected education information b; and a control unit 240 configured to control the display unit 210 and the input unit 220.

In addition, the control unit 240 may transmit score information d corresponding to the selection information c to the server 100 through the communication unit 230.

In addition, the control unit 240 may transmit examination information e corresponding to the selection information c to the server 100 through the communication unit 230.

In addition, the selection information c may include: equipment selection information c1; and equipment operation information c2.

In addition, the server 100 may include: a control unit 110; and a storage unit 120 configured to store the education information a, the score information d, and the examination information e.

In addition, the control unit 110 may control a standards information generation module 111; and an educational information assessment module 112.

In addition, the control unit 110 may generate standards information f stored in the storage unit 120 through the standards information generation module 111, wherein the standards information f may include: equipment selection standards information f1; and equipment operation standards information f2.

According to another aspect of the present invention, a method of measuring TBM device operation capability using the TBM operation simulation equipment includes: a first step S100 of receiving the selected education information b from the instruction client unit 200 through the input unit 220; a second step S200 of receiving the selection information c from the education client unit 300 through the input unit 320; and a third step S300 of receiving the score information d and the examination information e from the instruction client unit 200 through the input unit 220.

In this case, the method may further include a fourth step S400 of generating, the control unit 110 of the server 100, assessment information g through the education information assessment module 112, wherein the education information assessment module 112 may compare the selection information c and the standards information f to generate the assessment information g.

In addition, the method may further include a fifth step S500 of displaying the score information d, the examination information e, the standards information f and the assessment information gin the display unit 310 of the education client unit 300.

According to another aspect of the present invention, provided is a computer-readable recording medium in which a program for executing the method for measuring TBM device operation capability is recorded.

Advantageous Effects

According to the present invention, it is possible to improve TBM operation capability of TBM drivers and trainees by providing a TBM simulation environment in which the construction environment is realistically simulated.

According to the present invention, by extracting the standards information using the actual TBM operation database, there is an effect that the operation method of an experienced operator can be easily trained.

MODE FOR INVENTION

An embodiment of the TBM operation simulation equipment according to the present invention and a method of measuring TBM device operation capability using the same will be described in detail with reference to the accompanying drawings, and in the description with reference to the accompanying drawings, the same or corresponding components are assigned the same reference numbers, and redundant descriptions thereof will be omitted.

In addition, terms such as first and second used hereinafter are merely identification symbols for distinguishing the same or corresponding components, and the same or corresponding constituent elements are not limited by terms such as first and second.

In addition, the term "coupled" does not mean only a case in which each component is in direct physical contact with each other in the contact relationship between each component, and is to be used as a concept including a case in which different components are interposed between each component, and the components are in contact with the other components.

The present invention relates to a TBM operation simulation equipment. The present invention is characterized by realistically simulating the TBM equipment and operation conditions so that the TBM operation technology can be acquired without a large investment.

Hereinafter, a configuration of the TBM operation simulation equipment according to an embodiment of the present invention will be described with reference to the accompanying drawings.

Figure 1:
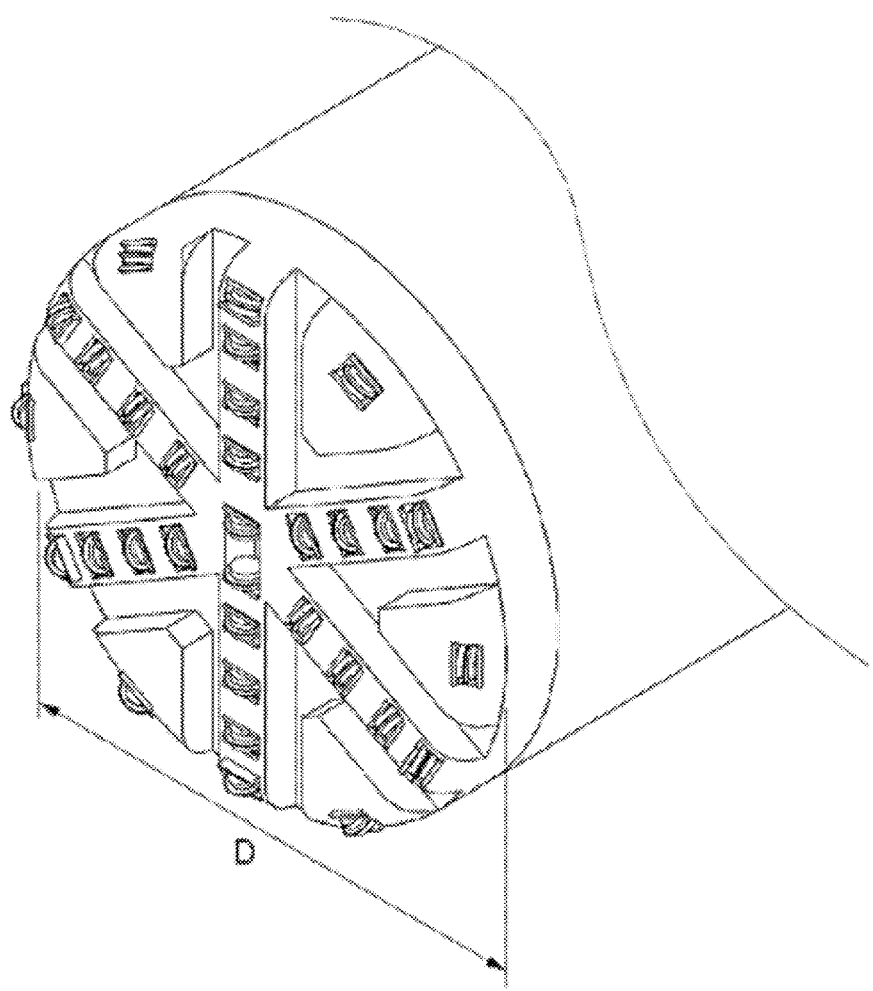
FIG. 1 is a diagram showing the configuration of a TBM according to an embodiment of the present invention.
Figure 2:
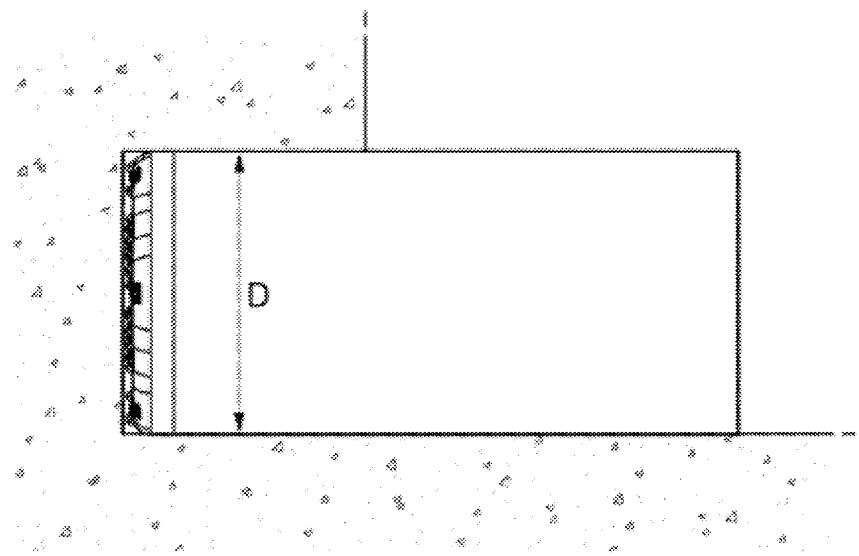
FIG. 2 is a view showing the excavation cross section of a TBM according to an embodiment of the present invention.
Figure 3:
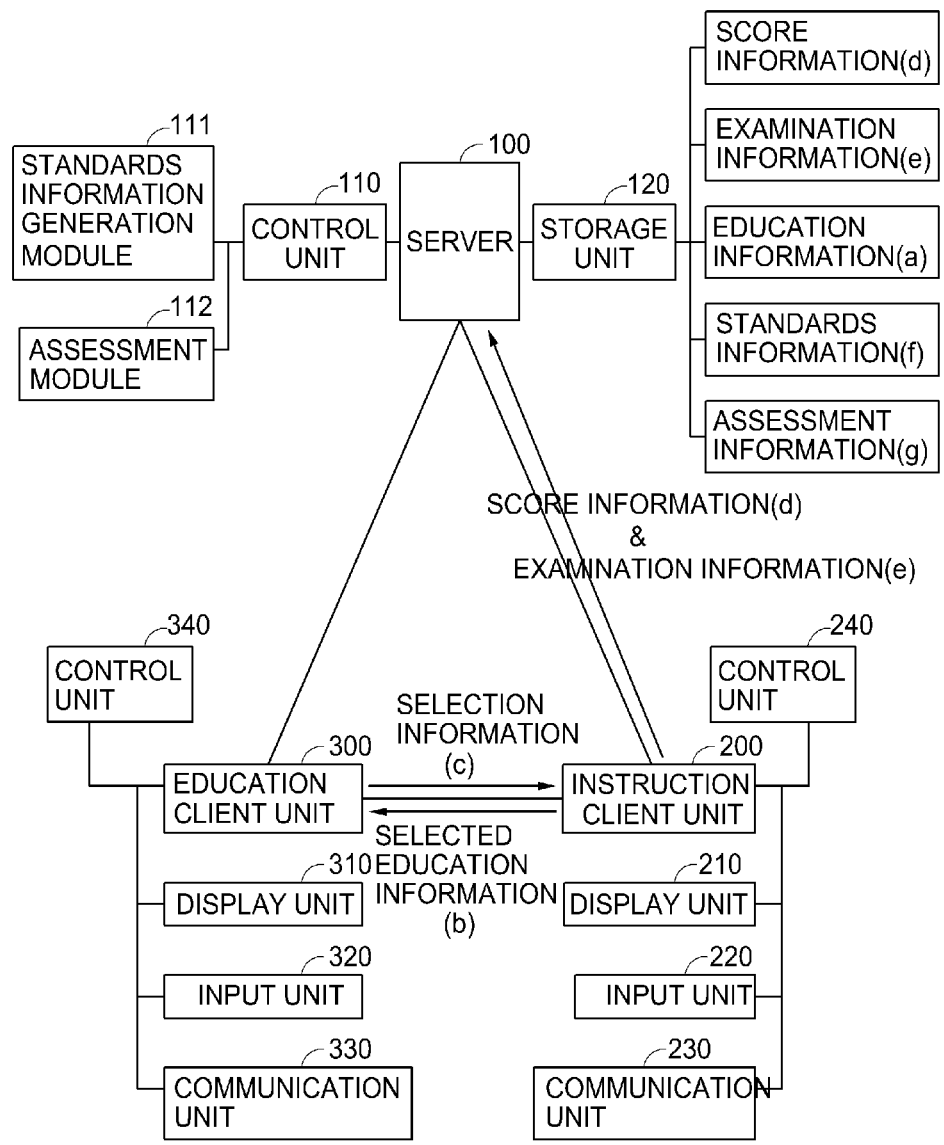
FIG. 3 is a block diagram of a TBM operation simulation equipment according to an embodiment of the present invention.
Figure 4:
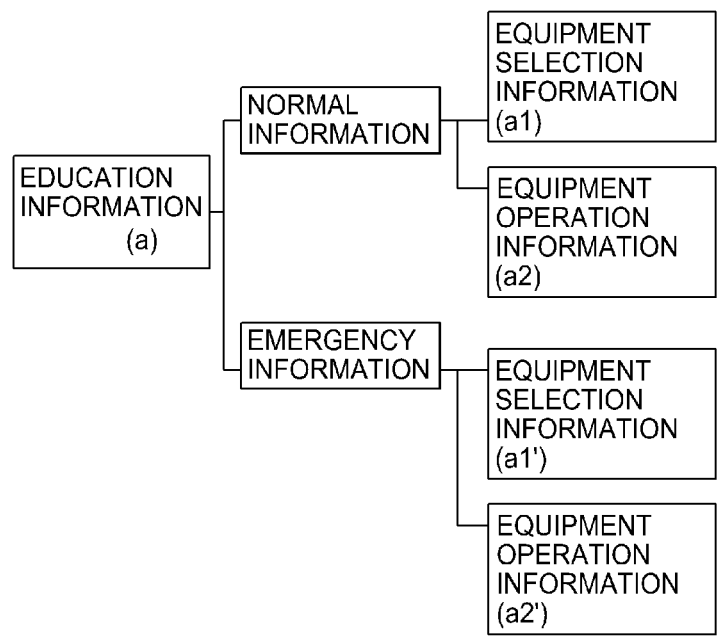
FIG. 4 is a configuration diagram of education information according to an embodiment of the present invention.
Figure 5:
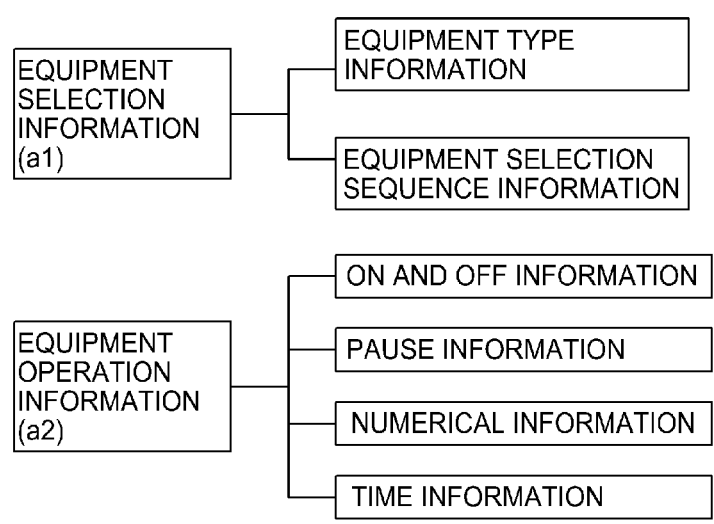
FIG. 5 is a configuration diagram of equipment selection information and equipment operation information according to an embodiment of the present invention.
Figure 6:
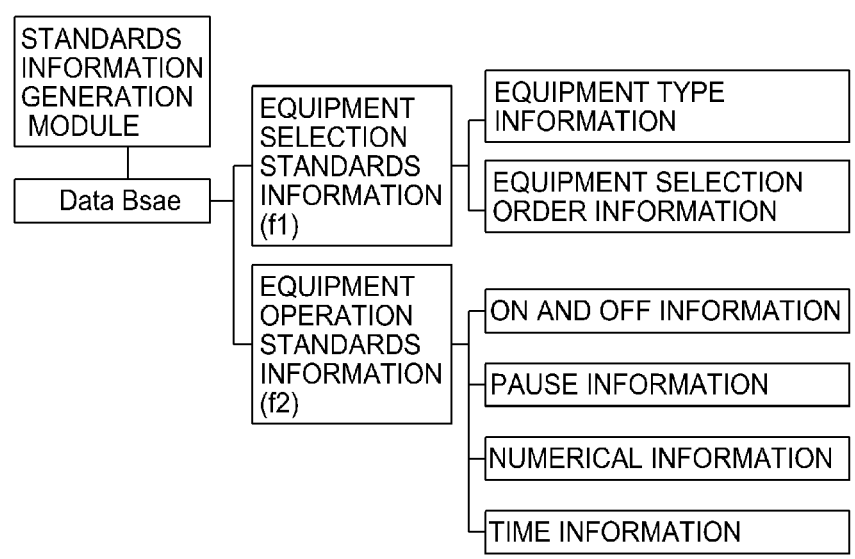
FIG. 6 is a configuration diagram of standards information according to an embodiment of the present invention.
Figure 7:
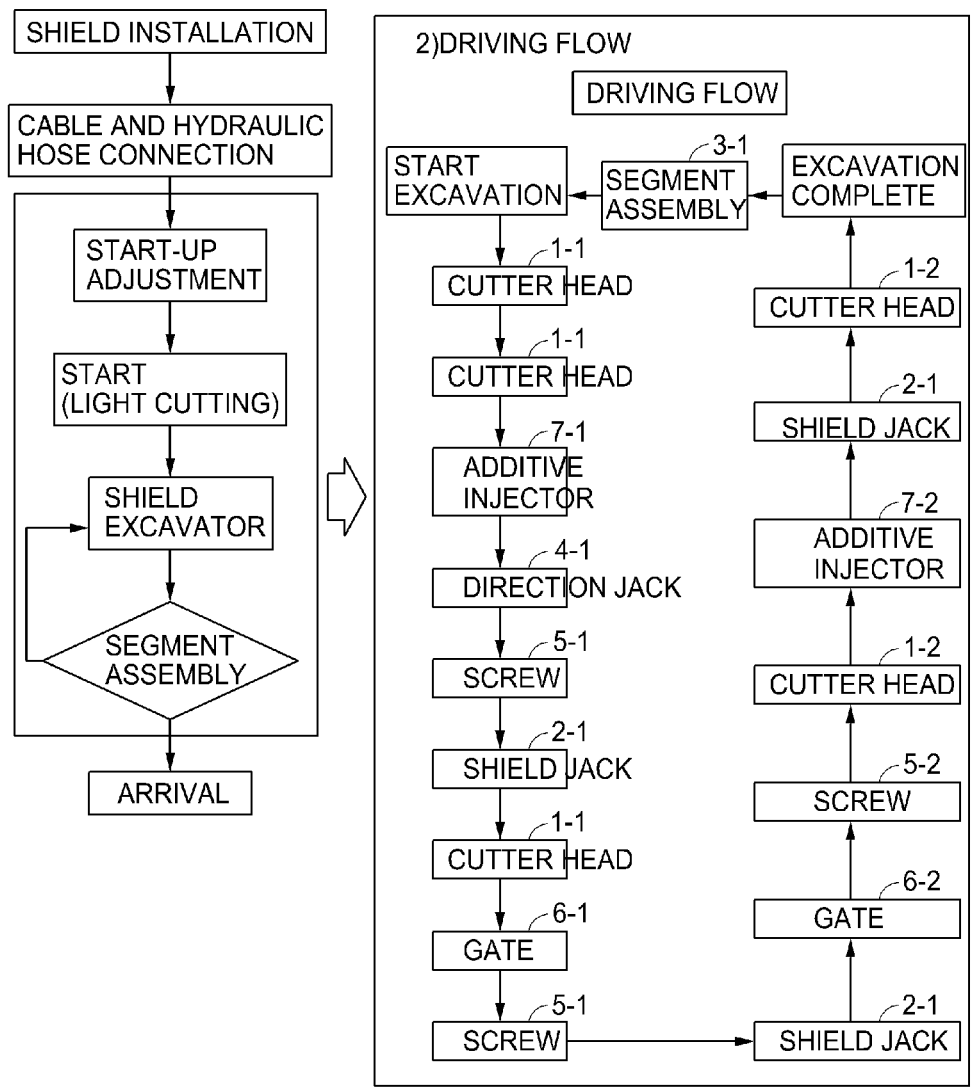
FIG. 7 is a configuration diagram of scenario information provided as education information according to an embodiment of the present invention.
Figure 8:
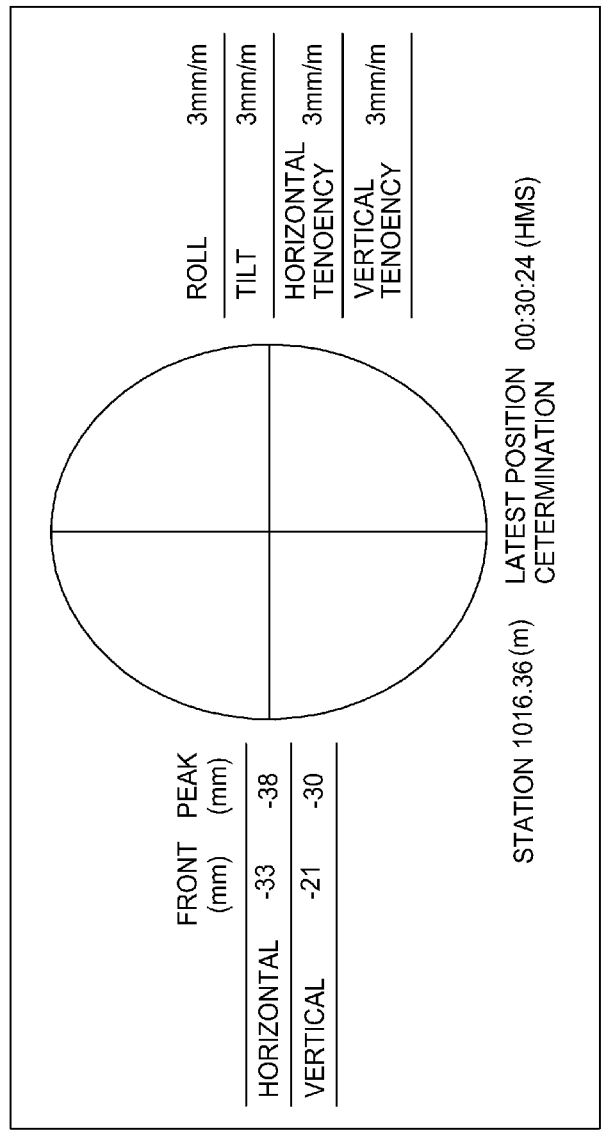
FIG. 8 is a capture screen showing selected education information and selection information displayed on a display unit and an input unit of an education client unit.

TBM operation simulation equipment according to an embodiment of the present invention includes a server 100 in which education information a is stored, and an instruction client unit 200 connected to the server 100 through a communication unit 230 and selecting some of the education information a as selected education information b and transmits the selected education information b to the education client unit 300 (FIG. 1).

The instruction client unit 200 is a client information communication device through which an education facilitator performs selection of education contents and assessment of education results.

In addition, the education client unit 300 corresponds to a client information communication device through which education students receive and transmit selection information c corresponding to the solution result according to the selected education information b selected through the instruction client unit 200.

The education client unit 300 includes a display unit 310 for displaying selected education information b, an input unit 320 for receiving selection information c corresponding to the selected education information b, and a control unit 340 for controlling the display unit 310 and the input unit 320 (FIG. 1).

The education client unit 300 may be connected to the server 100 and the instruction client unit 200 through the communication unit 330.

The input unit 320 has a feature that simulates the actual operating hardware of a TBM as it is.

The control unit 340 transmits the selection information c inputted through the input unit 320 to the instruction client unit 200.

The selection information c may include equipment selection information c1 and equipment operation information c2.

The equipment selection information c1 includes information on the type of specific equipment (cutter heads, shield jacks, etc.) for driving the TBM and the order of selection of the equipment.

The equipment operation information c2 may include on and off information, pause information, numerical information (torque, horsepower, speed, etc.) indicating the driving degree, and driving time information of each specific equipment selected in the equipment selection information c1.

The instruction client unit 200 may include a display unit 210 for displaying selection information c, an input unit 220 for receiving selected education information b, and a control unit 240 for controlling the display unit 210 and the input unit 220 (FIG. 1).

The control unit 240 transmits the score information d and examination information e generated based on the selection information c through the communication unit 230 to the server 100.

That is, the control unit 240 transmits to the server 100 score information d scored based on the result of the student's resolution and examination information e reflecting the opinion of the education facilitator.

The server 100 may include a control unit 110 and a storage unit 120 that stores education information a, score information d, examination information e, and standards information f.

In this case, the control unit 110 may control a standards information generation module 111 and an education information assessment module 112.

The standards information generation module 111 is an algorithm that generates standards information f, and here, the standards information f means actual TBM operation information close to education information a. That is, the standards information f corresponds to information obtained by extracting items corresponding to subcategories of the education information a based on a database containing information on which an experienced operation engineer actually operates a TBM at a construction site.

The control unit 110 analyzes the difference between the selection information c and the standards information f using the education information assessment module 112, and generates the result of arranging the difference between the two information as the assessment information g.

The education information assessment module 112 compares the item selected by the selection information c and the item selected by the standards information f from the options provided by the education information a. In addition, by comparing the surrounding conditions of the items selected by the selection information c and the surrounding conditions of the items selected by the standards information f, the contents are written in the assessment information g.

For example, by comparing the equipment selection information c1 in the selection information c and the equipment selection standards information f1 in the standards information f, options that differ from the common options are derived. In this case, if there are other options, the difference is specified in consideration of whether there is a difference in the surrounding conditions and whether there is no difference in the surrounding conditions.

Based on the assessment information g, trainees can compare the actual field situation with the situation in the education information a and learn the optimal choices for each case.

Trainees may check the score information d, the examination information e, the standards information f, and the assessment information g displayed by the display unit 310 in the education client unit 300.

Hereinafter, a method of measuring TBM device operation capability using the TBM operation simulation equipment according to an embodiment of the present invention will be described.

A method of measuring TBM device operation capability according to the present invention may include a first step S100 of receiving the selected education information b from the instruction client unit 200 through the input unit 220, a second step S200 of receiving the selection information c through the input unit 320 in the education client unit 300, and a third step S300 of receiving the score information d and the examination information e from the instruction client unit 200 through the input unit 220.

In this case, a fourth step S400 of generating, by the control unit 110 of the server 100, the assessment information g through the education information assessment module 112 is further included, and the education information assessment module 112 generates the assessment information g by comparing the selection information c and the standards information f.

In addition, a fifth step S500 of displaying the score information d, the examination information e, the standards information f, and the assessment information g on the display unit 310 of the education client unit 300 may be further included.

The method of measuring TBM device operation capability according to the present invention may further include a sixth step S600 of displaying standards information f on the display unit 310 of the education client unit 300.

In this case, trainees have the effect of being able to learn the contents of the choices of experienced technicians performed at the actual construction site along with the surrounding conditions.

In particular, the input unit 320 has an advantage of being able to simulate actual operating matters since it takes a form that simulates the actual operating hardware of TBM as it is.

The method of measuring TBM device operation capability according to an embodiment of the present invention may be implemented in the form of program instructions that can be executed through various computer means and recorded in a computer-readable medium.

The computer-readable medium may include program instructions, data files, data structures, etc. alone or in combination. The program instructions recorded in the medium may be specially designed and configured for the present invention, or may be known and usable to those skilled in computer software. Examples of computer-readable recording media include hardware devices specially configured to store and execute program instructions, for example, magnetic media such as hard disks, floppy disks and magnetic tapes, optical media such as CD-ROM and DVD, magneto-optical media such as a floptical disk, and ROM, RAM, flash memory, etc.

Examples of the program instructions include not only machine language codes such as those produced by a compiler, but also high-level language codes that can be executed by a computer using an interpreter or the like. The above-described hardware device may be configured to operate as one or more software modules to perform the operation of the present invention, and vice versa.

Since the above is only described with respect to some of the preferred embodiments that can be implemented by the present invention, as is well known, the scope of the present invention is limited to the above examples and should not be interpreted, and it will be understood that both the technical idea of the present invention described above and the technical idea together with the root thereof are included in the scope of the present invention.

INDUSTRIAL AVAILABILITY

The present invention relates to a TBM simulation equipment capable of improving TBM operation capability, and the industrial applicability is recognized.

What is claimed is:
1. A tunnel boring machine (TBM) operation simulation equipment comprising:
a server in which education information is stored; and
an instruction client unit that is connected to the server through a first communication unit and selects some of the education information as selected education information and transmits the selected education information to an education client unit, wherein the education client unit comprises:
a first display unit configured to display the selected education information;
a first input unit configured to receive selection information e corresponding to the selected education information; and
a first control unit configured to control the first display unit and the first input unit,
wherein the education client unit is connected to the server and the instruction client unit through a second communication unit,
wherein the first control unit transmits the selection information inputted through the first input unit to the instruction client unit, and
wherein the instruction client unit comprises:
a second display unit configured to display the selection information;
a second input unit configured to receive the selected education information; and
a second control unit configured to control the second display unit and the second input unit.

2. The TBM operation simulation equipment of claim 1, wherein the second control unit transmits score information corresponding to the selection information to the server through the first communication unit.

3. The TBM operation simulation equipment of claim 2, wherein the second control unit transmits examination information corresponding to the selection information to the server through the first communication unit.

4. The TBM operation simulation equipment of claim 3, wherein the selection information comprises:
equipment selection information; and
equipment operation information.

5. The TBM operation simulation equipment of claim 4, wherein the server comprises:
a third control unit; and
a storage unit configured to store the education information, the score information, and the examination information.

6. The TBM operation simulation equipment of claim 5, wherein the third control unit controls
a standards information generation module; and
an educational information assessment module.

7. The TBM operation simulation equipment of claim 6, wherein the third control unit generates standards information stored in the storage unit through the standards information generation module,
wherein the standards information comprises:
equipment selection standards information; and
equipment operation standards information.

8. A method of measuring a tunnel boring machine (TBM) device operation capability using the TBM operation simulation equipment of claim 7, the method comprising:
a first step of receiving the selected education information from the instruction client unit through the second input unit;
a second step of receiving the selection information e from the education client unit through the first input unit; and
a third step of receiving the score information and the examination information from the instruction client unit through the second input unit.

9. The method of claim 8, further comprising a fourth step of generating by the third control unit of the server, assessment information through the education information assessment module,
wherein the education information assessment module compares the selection information and the standards information to generate the assessment information.

10. The method of claim 9, further comprising a fifth step of displaying the score information, the examination information, the standards information and the assessment information in the first display unit of the education client unit.

11. A computer-readable recording medium in which a program for executing the method for measuring a tunnel boring machine device operation capability according to claim 10 is recorded.

* * * * *